(12) United States Patent
Ritenour (10) Patent No.: US 9,202,874 B2
(45) Date of Patent: Dec. 1, 2015

(54) GALLIUM NITRIDE (GAN) DEVICE WITH LEAKAGE CURRENT-BASED OVER-VOLTAGE PROTECTION

(71) Applicant: RF Micro Devices, Inc., Greensboro, NC (US)

(72) Inventor: Andrew P. Ritenour, Colfax, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/957,698

(22) Filed: Aug. 2, 2013

(65) Prior Publication Data

US 2014/0054601 A1    Feb. 27, 2014

Related U.S. Application Data

(60) Provisional application No. 61/692,768, filed on Aug. 24, 2012.

(51) Int. Cl.
*H01L 29/20*  (2006.01)
*H01L 29/423* (2006.01)
*H01L 29/778* (2006.01)

(52) U.S. Cl.
CPC ........ *H01L 29/2003* (2013.01); *H01L 29/4238* (2013.01); *H01L 29/42316* (2013.01); *H01L 29/42368* (2013.01); *H01L 29/778* (2013.01)

(58) Field of Classification Search
CPC ..................... H01L 29/785; H01L 21/823807; H01L 29/66795; H01L 29/78; H01L 21/823412; H01L 29/20; H01L 29/2003
USPC .................................. 257/76, 43, 22, 190, 15
See application file for complete search history.

(56) References Cited

U.S. PATENT DOCUMENTS

| 4,317,055 A | 2/1982 | Yoshida et al. |
| 4,540,954 A | 9/1985 | Apel |

(Continued)

FOREIGN PATENT DOCUMENTS

| EP | 1187229 A1 | 3/2002 |
| EP | 1826041 A1 | 8/2007 |

(Continued)

OTHER PUBLICATIONS

Cho, H., et al., "High Density Plasma Via Hole Etching in SiC," Journal of Vacuum Science & Technology A: Surfaces, and Films, vol. 19, No. 4, Jul./Aug. 2001, pp. 1878-1881.

(Continued)

*Primary Examiner* — Chuong A Luu
*Assistant Examiner* — Rodolfo Fortich
(74) *Attorney, Agent, or Firm* — Withrow & Terranova, P.L.L.C.

(57) ABSTRACT

A gallium nitride (GaN) device with leakage current-based over-voltage protection is disclosed. The GaN device includes a drain and a source disposed on a semiconductor substrate. The GaN device also includes a first channel region within the semiconductor substrate and between the drain and the source. The GaN device further includes a second channel region within the semiconductor substrate and between the drain and the source. The second channel region has an enhanced drain induced barrier lowering (DIBL) that is greater than the DIBL of the first channel region. As a result, a drain voltage will be safely clamped below a destructive breakdown voltage once a substantial drain current begins to flow through the second channel region.

14 Claims, 3 Drawing Sheets

(56) References Cited

U.S. PATENT DOCUMENTS

| | | |
|---|---|---|
| 4,543,535 A | 9/1985 | Ayasli |
| 4,620,207 A | 10/1986 | Calviello |
| 4,788,511 A | 11/1988 | Schindler |
| 5,028,879 A | 7/1991 | Kim |
| 5,046,155 A | 9/1991 | Beyer et al. |
| 5,047,355 A | 9/1991 | Huber et al. |
| 5,107,323 A | 4/1992 | Knolle et al. |
| 5,118,993 A | 6/1992 | Yang |
| 5,208,547 A | 5/1993 | Schindler |
| 5,227,734 A | 7/1993 | Schindler et al. |
| 5,306,656 A | 4/1994 | Williams et al. |
| 5,361,038 A | 11/1994 | Allen et al. |
| 5,365,197 A | 11/1994 | Ikalainen |
| 5,389,571 A | 2/1995 | Takeuchi et al. |
| 5,414,387 A | 5/1995 | Nakahara et al. |
| 5,485,118 A | 1/1996 | Chick |
| 5,608,353 A | 3/1997 | Pratt |
| 5,629,648 A | 5/1997 | Pratt |
| 5,698,870 A | 12/1997 | Nakano et al. |
| 5,742,205 A | 4/1998 | Cowen et al. |
| 5,764,673 A | 6/1998 | Kawazu et al. |
| 5,834,326 A | 11/1998 | Miyachi et al. |
| 5,843,590 A | 12/1998 | Miura et al. |
| 5,864,156 A | 1/1999 | Juengling |
| 5,874,747 A | 2/1999 | Redwing et al. |
| 5,880,640 A | 3/1999 | Dueme |
| 5,914,501 A | 6/1999 | Antle et al. |
| 5,949,140 A | 9/1999 | Nishi et al. |
| 6,049,250 A | 4/2000 | Kintis et al. |
| 6,064,082 A | 5/2000 | Kawai et al. |
| 6,110,757 A | 8/2000 | Udagawa et al. |
| 6,130,579 A | 10/2000 | Iyer et al. |
| 6,133,589 A | 10/2000 | Krames et al. |
| 6,177,685 B1 | 1/2001 | Teraguchi et al. |
| 6,191,656 B1 | 2/2001 | Nadler |
| 6,229,395 B1 | 5/2001 | Kay |
| 6,265,943 B1 | 7/2001 | Dening et al. |
| 6,271,727 B1 | 8/2001 | Schmukler |
| 6,285,239 B1 | 9/2001 | Iyer et al. |
| 6,306,709 B1 | 10/2001 | Miyagi et al. |
| 6,307,364 B1 | 10/2001 | Augustine |
| 6,313,705 B1 | 11/2001 | Dening et al. |
| 6,329,809 B1 | 12/2001 | Dening et al. |
| 6,333,677 B1 | 12/2001 | Dening |
| 6,342,815 B1 | 1/2002 | Kobayashi |
| 6,356,150 B1 | 3/2002 | Spears et al. |
| 6,369,656 B2 | 4/2002 | Dening et al. |
| 6,369,657 B2 | 4/2002 | Dening et al. |
| 6,373,318 B1 | 4/2002 | Dohnke et al. |
| 6,376,864 B1 | 4/2002 | Wang |
| 6,377,125 B1 | 4/2002 | Pavio et al. |
| 6,384,433 B1 | 5/2002 | Barratt et al. |
| 6,387,733 B1 | 5/2002 | Holyoak et al. |
| 6,392,487 B1 | 5/2002 | Alexanian |
| 6,400,226 B2 | 6/2002 | Sato |
| 6,404,287 B2 | 6/2002 | Dening et al. |
| 6,448,793 B1 | 9/2002 | Barratt et al. |
| 6,455,877 B1 | 9/2002 | Ogawa et al. |
| 6,475,916 B1 | 11/2002 | Lee et al. |
| 6,477,682 B2 | 11/2002 | Cypher |
| 6,521,998 B1 | 2/2003 | Teraguchi et al. |
| 6,525,611 B1 | 2/2003 | Dening et al. |
| 6,528,983 B1 | 3/2003 | Augustine |
| 6,560,452 B1 | 5/2003 | Shealy |
| 6,566,963 B1 | 5/2003 | Yan et al. |
| 6,589,877 B1 | 7/2003 | Thakur |
| 6,593,597 B2 | 7/2003 | Sheu |
| 6,608,367 B1 | 8/2003 | Gibson et al. |
| 6,614,281 B1 | 9/2003 | Baudelot et al. |
| 6,621,140 B1 | 9/2003 | Gibson et al. |
| 6,624,452 B2 | 9/2003 | Yu et al. |
| 6,627,552 B1 | 9/2003 | Nishio et al. |
| 6,633,073 B2 | 10/2003 | Rezvani et al. |
| 6,633,195 B2 | 10/2003 | Baudelot et al. |
| 6,639,470 B1 | 10/2003 | Andrys et al. |
| 6,656,271 B2 | 12/2003 | Yonehara et al. |
| 6,657,592 B2 | 12/2003 | Dening et al. |
| 6,660,606 B2 | 12/2003 | Miyabayashi et al. |
| 6,701,134 B1 | 3/2004 | Epperson |
| 6,701,138 B2 | 3/2004 | Epperson et al. |
| 6,706,576 B1 | 3/2004 | Ngo et al. |
| 6,720,831 B2 | 4/2004 | Dening et al. |
| 6,723,587 B2 | 4/2004 | Cho et al. |
| 6,724,252 B2 | 4/2004 | Ngo et al. |
| 6,727,762 B1 | 4/2004 | Kobayashi |
| 6,748,204 B1 | 6/2004 | Razavi et al. |
| 6,750,158 B2 | 6/2004 | Ogawa et al. |
| 6,750,482 B2 | 6/2004 | Seaford et al. |
| 6,759,907 B2 | 7/2004 | Orr et al. |
| 6,802,902 B2 | 10/2004 | Beaumont et al. |
| 6,815,722 B2 | 11/2004 | Lai et al. |
| 6,815,730 B2 | 11/2004 | Yamada |
| 6,822,842 B2 | 11/2004 | Friedrichs et al. |
| 6,861,677 B2 | 3/2005 | Chen |
| 6,943,631 B2 | 9/2005 | Scherrer et al. |
| 7,015,512 B2 | 3/2006 | Park et al. |
| 7,026,665 B1 | 4/2006 | Smart et al. |
| 7,033,961 B1 | 4/2006 | Smart et al. |
| 7,042,150 B2 | 5/2006 | Yasuda |
| 7,052,942 B1 | 5/2006 | Smart et al. |
| 7,211,822 B2 | 5/2007 | Nagahama et al. |
| 7,408,182 B1 | 8/2008 | Smart et al. |
| 7,449,762 B1 | 11/2008 | Singh |
| 7,459,356 B1 | 12/2008 | Smart et al. |
| 7,557,421 B1 | 7/2009 | Shealy et al. |
| 7,719,055 B1 | 5/2010 | McNutt et al. |
| 7,768,758 B2 | 8/2010 | Maier et al. |
| 7,804,262 B2 | 9/2010 | Schuster et al. |
| 7,935,983 B2 | 5/2011 | Saito et al. |
| 7,968,391 B1 | 6/2011 | Smart et al. |
| 7,974,322 B2 | 7/2011 | Ueda et al. |
| 8,017,981 B2 | 9/2011 | Sankin et al. |
| 8,405,068 B2 | 3/2013 | O'Keefe |
| 8,502,258 B2 | 8/2013 | O'Keefe |
| 8,633,518 B2 | 1/2014 | Suh et al. |
| 8,692,294 B2 | 4/2014 | Chu et al. |
| 8,785,976 B2 | 7/2014 | Nakajima et al. |
| 8,988,097 B2 | 3/2015 | Ritenour |
| 2001/0040246 A1 | 11/2001 | Ishii |
| 2001/0054848 A1 | 12/2001 | Baudelot et al. |
| 2002/0031851 A1 | 3/2002 | Linthicum et al. |
| 2002/0048302 A1 | 4/2002 | Kimura |
| 2002/0079508 A1 | 6/2002 | Yoshida |
| 2003/0003630 A1 | 1/2003 | Iimura et al. |
| 2003/0122139 A1 | 7/2003 | Meng et al. |
| 2003/0160307 A1 | 8/2003 | Gibson et al. |
| 2003/0160317 A1 | 8/2003 | Sakamoto et al. |
| 2003/0206440 A1* | 11/2003 | Wong ............... 365/185.11 |
| 2003/0209730 A1 | 11/2003 | Gibson et al. |
| 2003/0218183 A1 | 11/2003 | Micovic et al. |
| 2004/0070003 A1 | 4/2004 | Gaska et al. |
| 2004/0130037 A1 | 7/2004 | Mishra et al. |
| 2004/0241916 A1* | 12/2004 | Chau et al. ............... 438/149 |
| 2005/0139868 A1 | 6/2005 | Anda |
| 2005/0189559 A1 | 9/2005 | Saito et al. |
| 2005/0189562 A1 | 9/2005 | Kinzer et al. |
| 2005/0194612 A1 | 9/2005 | Beach |
| 2005/0212049 A1 | 9/2005 | Onodera |
| 2005/0225912 A1 | 10/2005 | Pant et al. |
| 2005/0271107 A1 | 12/2005 | Murakami et al. |
| 2006/0043385 A1 | 3/2006 | Wang et al. |
| 2006/0068601 A1 | 3/2006 | Lee et al. |
| 2006/0124960 A1 | 6/2006 | Hirose et al. |
| 2006/0205161 A1 | 9/2006 | Das et al. |
| 2006/0243988 A1 | 11/2006 | Narukawa et al. |
| 2007/0093009 A1 | 4/2007 | Baptist et al. |
| 2007/0295985 A1 | 12/2007 | Weeks, Jr. et al. |
| 2008/0023706 A1 | 1/2008 | Saito et al. |
| 2008/0073752 A1 | 3/2008 | Asai et al. |
| 2008/0112448 A1 | 5/2008 | Ueda et al. |
| 2008/0121875 A1 | 5/2008 | Kim |
| 2008/0142837 A1 | 6/2008 | Sato et al. |
| 2008/0179737 A1 | 7/2008 | Haga et al. |
| 2008/0190355 A1 | 8/2008 | Chen et al. |

(56) References Cited

U.S. PATENT DOCUMENTS

| | | |
|---|---|---|
| 2008/0272382 A1 | 11/2008 | Kim et al. |
| 2008/0272422 A1* | 11/2008 | Min .............................. 257/314 |
| 2008/0283821 A1 | 11/2008 | Park et al. |
| 2008/0308813 A1 | 12/2008 | Suh et al. |
| 2009/0072269 A1 | 3/2009 | Suh et al. |
| 2009/0090984 A1 | 4/2009 | Khan et al. |
| 2009/0146185 A1 | 6/2009 | Suh et al. |
| 2009/0146186 A1 | 6/2009 | Kub et al. |
| 2009/0166677 A1 | 7/2009 | Shibata et al. |
| 2009/0273002 A1 | 11/2009 | Chiou et al. |
| 2009/0278137 A1 | 11/2009 | Sheridan et al. |
| 2010/0025657 A1 | 2/2010 | Nagahama et al. |
| 2010/0133567 A1 | 6/2010 | Son |
| 2010/0187575 A1 | 7/2010 | Baumgartner et al. |
| 2010/0207164 A1 | 8/2010 | Shibata et al. |
| 2010/0230656 A1 | 9/2010 | O'Keefe |
| 2010/0230717 A1 | 9/2010 | Saito |
| 2010/0258898 A1 | 10/2010 | Lahreche |
| 2011/0017972 A1 | 1/2011 | O'Keefe |
| 2011/0025422 A1 | 2/2011 | Marra et al. |
| 2011/0031633 A1 | 2/2011 | Hsu et al. |
| 2011/0095337 A1 | 4/2011 | Sato |
| 2011/0101300 A1 | 5/2011 | O'Keefe |
| 2011/0115025 A1 | 5/2011 | Okamoto |
| 2011/0127586 A1 | 6/2011 | Bobde et al. |
| 2011/0163342 A1 | 7/2011 | Kim et al. |
| 2011/0175142 A1 | 7/2011 | Tsurumi et al. |
| 2011/0199148 A1 | 8/2011 | Iwamura |
| 2011/0211289 A1 | 9/2011 | Kosowsky et al. |
| 2011/0242921 A1 | 10/2011 | Tran et al. |
| 2011/0290174 A1 | 12/2011 | Leonard et al. |
| 2012/0018735 A1 | 1/2012 | Ishii |
| 2012/0086497 A1 | 4/2012 | Vorhaus |
| 2012/0126240 A1 | 5/2012 | Won |
| 2012/0199875 A1 | 8/2012 | Bhalla et al. |
| 2012/0211802 A1 | 8/2012 | Tamari |
| 2012/0218783 A1 | 8/2012 | Imada |
| 2012/0262220 A1 | 10/2012 | Springett |
| 2013/0277687 A1 | 10/2013 | Kobayashi et al. |
| 2013/0280877 A1 | 10/2013 | Kobayashi et al. |
| 2014/0015609 A1 | 1/2014 | Vetury et al. |
| 2014/0054585 A1 | 2/2014 | Ritenour |
| 2014/0054596 A1 | 2/2014 | Ritenour |
| 2014/0054597 A1 | 2/2014 | Ritenour et al. |
| 2014/0054602 A1 | 2/2014 | Johnson |
| 2014/0054604 A1 | 2/2014 | Ritenour |
| 2014/0055192 A1 | 2/2014 | Ritenour et al. |
| 2014/0057372 A1 | 2/2014 | Ritenour |
| 2014/0117559 A1 | 5/2014 | Zimmerman et al. |
| 2014/0118074 A1 | 5/2014 | Levesque et al. |
| 2015/0155222 A1 | 6/2015 | Shealy et al. |

FOREIGN PATENT DOCUMENTS

| | | |
|---|---|---|
| JP | 10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |
| WO | 2014035794 A1 | 3/2014 |

OTHER PUBLICATIONS

Krüger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.

Chang, S.J. et al., "Improved ESD protection by combining InGaN—GaN MQW LEDs with GaN Schottky diodes," IEEE Electron Device Letters, Mar. 2003, vol. 24, No. 3, pp. 129-131.

Chao, C-H., et al., "Theoretical demonstration of enhancement of light extraction of flip-chip GaN light-emitting diodes with photonic crystals," Applied Physics Letters, vol. 89, 2006, 4 pages.

Han, D.S. et al., "Improvement of Light Extraction Efficiency of Flip-Chip Light Emitting Diode by Texturing the Bottom Side Surface of Sapphire Substrate," IEEE Photonics Technology Letters, Jul. 1, 2006, vol. 18, No. 13, pp. 1406-1408.

Shchekin, O.B. et al., "High performance thin-film flip-chip InGaN—GaN light-emitting diodes," Applied Physics Letters, vol. 89, 071109, Aug. 2006, 4 pages.

Wierer, J. et al., "High-power AlGaInN flip-chip light-emitting diodes," Applied Physics Letters, vol. 78 No. 22, May 28, 2001, pp. 3379-3381.

Final Office Action for U.S. Appl. No. 131973,482, mailed Nov. 5, 2014, 9 pages.

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.

Fath, P. et al., "Mechanical wafer engineering for high efficiency solar cells: an investigation of the induced surface damage," Conference Record of the Twenty-Fourth IEEE Photovoltaic Specialists Conference, 5-9 Dec. 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006

Examination Report for British Patent Application No. GB090255.6, issued Feb. 28, 2013, 2 pages.

Final Office Action for U.S. Appl. No. 12/841,225, mailed Feb. 1, 2012, 9 pages.

Non-Final Office Action for U.S. Appl. No. 12/841,2525, mailed May 2, 2012, 10 pages.

Boutros, K.S., et al., "5W GaN MMIC for Millimeter-Wave Applications," 2006 Compound Semiconductor Integrated Circuit Symposium, Nov. 2006, pp. 93-95.

Cho, H., et al., "High Density Plasma Via Hole Etching in SiC," Journal of Vacuum Science & Technology A: Surfaces, and Films, vol. 19, No. 4, Jul.-Aug. 2001, pp. 1878-1881.

Darwish, A.M., et al., "Dependence of GaN HEMT Millimeter-Wave Performance on Temperature," IEEE Transactions on Microwave Theory and Techniques, vol. 57, No. 12, Dec. 2009, pp. 3205-3211.

Krüger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.

Sheppard, S.T., et al., "High Power Demonstration at 10 GHz with GaN/AlGaN HEMT Hybrid Amplifiers," 2000 Device Research Conference, Conference Digest, Jun. 2000, pp. 37-38.

Non-Final Office Action for U.S. Appl. No. 13/795,926, mailed Dec. 19, 2014, 14 pages.

Non-Final Office Action for U.S. Appl. No. 13/942,998, mailed Nov. 19, 2014, 9 pages.

Non-Final Office Action for U.S. Appl. No. 13/871,526, mailed Dec. 16, 2014, 17 pages.

Final Office Action for U.S. Appl. No. 13/910,202, mailed Jan. 20, 2015, 10 pages.

Notice of Allowance for U.S. Appl. No. 13/914,060, mailed Nov. 13, 2014, 8 pages.

Final Office Action for U.S. Appl. No. 13/966,400, mailed Dec. 3, 2014, 8 pages.

Final Office Action for U.S. Appl. No. 13/795,986, mailed Dec. 5, 2014, 16 pages.

Author Unknown, "CGHV1J006D: 6 W, 18.0 GHz, GaN HEMT Die," Cree, Inc., 2014, 9 pages.

Chang, S.J. et al, "Improved ESD protection by combining InGaN-GaN Mqw LEDs with GaN Schottky diodes," IEEE Electron Device Letters, Mar. 2003, vol. 24, No. 3, pp. 129-131.

Chao, C-H., et aL, "Theoretical demonstration of enhancement of light extraction of flip-chip GaN light-emitting diodes with photonic crystals," Applied Physics Letters, vol. 89, 2006, 4 pages.

(56) References Cited

OTHER PUBLICATIONS

Fath, P. et al., "Mechanical wafer engineering for high efficiency solar cells: An investigation of the induced surface damage," Conference Record of the Twenty-Fourth IEEE Photovoltaic Specialists Conference, Dec. 5-9 1994, vol. 2, pp. 1347-1350.
Han, D.S. et al., "Improvement of Light Extraction Efficiency of Flip-Chip Lighting-Emitting Diode by Texturing the Bottom Side Surface of Sapphire Substrate," IEEE Photonics Technology Letters, Jul. 1, 2006, vol. 18, No. 13, pp. 1406-1408.
Hibbard, D.L. et al., "Low Resistance High Reflectance Contacts to p-GaN Using Oxidized Ni/Au and Al or Ag," Applied Physics Letters, vol. 83 No. 2, Jul. 14, 2003, pp. 311-313.
Lee, S.J., "Study of photon extraction efficiency in InGaN light-emitting diodes depending on chip structures and chip-mount schemes," Optical Engineering, SPIE, Jan. 2006, vol. 45, No. 1, 14 pages.
Shchekin, O.B. et al., "High performance thin-film flip-chip InGaN-GaN light-emitting diodes," Applied Physics Letters, vol. 89, 071109, Aug. 2006, 4 pages.
Wierer, J. et al., "High-power AlGaInN flip-chip light-emitting diodes," Applied Physics Letters, vol. 78 No. 22, May 28, 2001, pp. 3379-3381.
Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.
Windisch, R. et al., "Impact of texture-enhanced transmission on high-efficiency surface-textured light-emitting diodes," Applied Physics Letters, Oct. 8, 2001, vol. 79, No. 15, pp. 2315-2317.
Advisory Action for U.S. Appl. No. 10/620,205, mailed Feb. 15, 2005, 2 pages.
Final Office Action for U.S. Appl. No. 10/620,205, mailed Dec. 16, 2004, 9 pages.
Non-Final Office Action for U.S. Appl. No. 10/620,205, mailed Jul. 23, 2004, 7 pages.
Non-Final Office Action for U.S. Appl. No. 10/620,205, mailed May 3, 2005, 10 pages.
Notice of Allowance for U.S. Appl. No. 10/620,205, mailed Dec. 8, 2005, 4 pages.
Non-Final Office Action for U.S. Appl. No. 10/689,980, mailed Jan. 26, 2005, 7 pages.
Non-Final Office Action for U.S. Appl. No. 10/689,980, mailed May 12, 2005, 8 pages.
Non-Final Office Action for U.S. Appl. No. 12/841,225 mailed Dec. 22, 2011, 8 pages.
Non-Final Office Action for U.S. Appl. No. 11/397,279, mailed Oct. 31, 2007, 7 pages.
Notice of Allowance for U.S. Appl. No. 11/397,279, mailed Apr. 17, 2008, 7 pages.
Final Office Action for U.S. Appl. No. 10/689,979, mailed Jun. 29, 2005, 16 pages.
Non-Final Office Action for U.S. Appl. No. 10/689,979, mailed Jan. 11, 2005, 14 pages.
Notice of Allowance for U.S. Appl. No. 10/689,979, mailed Oct. 26, 2005, 6 pages.
Notice of Allowance for U.S. Appl. No. 12/841,225, mailed Nov. 9, 2012, 5 pages.
Non-Final Office Action for U.S. Appl. No. 11/360,734, mailed Jan. 18, 2008, 10 pages.
Notice of Allowance for U.S. Appl. No. 11/360,734, mailed Aug. 7, 2008, 6 pages.
Non-Final Office Action for U.S. Appl. No. 12/841,257 mailed Jan. 5, 2012, 13 pages.
Advisory Action for U.S. Appl. No. 11/937,207, mailed Feb. 2, 2010, 2 pages.
Final Office Action for U.S. Appl. No. 11/937,207, mailed Nov. 19, 2009, 9 pages.
Non-Final Office Action for U.S. Appl. No. 11/937,207, mailed Mar. 18, 2010, 10 pages.
Non-Final Office Action for U.S. Appl. No. 11/937,207, mailed May 29, 2009, 11 pages.
Notice of Allowance for U.S. Appl. No. 11/937,207, mailed Feb. 28, 2011, 8 pages.
Quayle Action for U.S. Appl. No. 11/937,207, mailed Nov. 24, 2010, 4 pages.
Final Office Action for U.S. Appl. No. 11/458,833, mailed Dec. 15, 2008, 13 pages.
Non-Final Office Action for U.S. Appl. No. 11/458,833, mailed Apr. 1, 2008, 10 pages.
Notice of Allowance for U.S. Appl. No. 11/458,833, mailed Mar. 9, 2009, 7 pages.
Invitation to Pay Fees for PCT/US2013/056105, mailed Nov. 5, 2013, 7 pages.
International Search Report and Written Opinion for PCT/US2013/056126, mailed Oct. 25, 2013, 10 pages.
International Search Report and Written Opinion for PCT/US2013/056132, mailed Oct. 10, 2013, 11 pages.
International Search Report and Written Opinion for PCT/US2013/056187, mailed Oct. 10, 2013, 11 pages.
International Search Report for GB0902558.6, issued Jun. 15, 2010, by the UK Intellectual Property Office, 2 pages.
Examination Report for British Patent Application No. 0902558.6, mailed Nov. 16, 2012, 5 pages.
Examination Report for British Patent Application No. GB0902558.6, issued Feb. 28, 2013, 2 pages.
Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
International Preliminary Report on Patentability for PCT/US2013/056105, mailed Mar. 5, 2015, 12 pages.
International Preliminary Report on Patentability for PCT/US2013/056126, mailed Mar. 5, 2015, 7 pages.
International Preliminary Report on Patentability for PCT/US2013/056132, mailed Mar. 5, 2015, 9 pages.
International Preliminary Report on Patentability for PCT/US2013/056187, mailed Mar. 12, 2015, 9 pages.
Advisory Action for U.S. Appl. No. 13/910,202, mailed Apr. 6, 2015, 3 pages.
Final Office Action for U.S. Appl. No. 13/974,488, mailed Feb. 20, 2015, 8 pages.
Notice of Allowance for U.S. Appl. No. 13/966,400, mailed Feb. 20, 2015, 8 pages.
Notice of Allowance for U.S. Appl. No. 13/795,986, mailed Mar. 6, 2015, 8 pages.
Non-Final Office Action for U.S. Appl. No. 14/067,019, mailed Mar. 25, 2015, 7 pages.
International Search Report and Written Opinion for PCT/US2013/056105, mailed Feb. 12, 2014, 15 pages.
Notice of Allowance for U.S. Appl. No. 13/795,926, mailed Apr. 27, 2015, 8 pages.
Notice of Allowance for U.S. Appl. No. 13/942,998, mailed Apr. 27, 2015, 8 pages.
Final Office Action for U.S. Appl. No. 13/871,526, mailed Jun. 17, 2015, 11 pages.
Notice of Allowance for U.S. Appl. No. 13/910,202, mailed May 14, 2015, 9 pages.
Notice of Allowance for U.S. Appl. No. 13/974,488, mailed May 29, 2015, 9 pages.
Notice of Allowance for U.S. Appl. No. 13/973,482, mailed May 4, 2015, 7 pages.
Non-Final Office Action for U.S. Appl. No. 13/927,182, mailed May 1, 2014, 7 pages.

(56) References Cited

OTHER PUBLICATIONS

Non-Final Office Action for U.S. Appl. No. 13/973,482, mailed May 23, 2014, 8 pages.
Non-Final Office Action for U.S. Appl. No. 13/795,986, mailed Apr. 24, 2014, 13 pages.
Non-Final Office Action for U.S. Appl. No. 13/910,202, mailed Sep. 25, 2014, 9 pages.
Final Office Action for U.S. Appl. No. 13/927,182, mailed Sep. 17, 2014, 10 pages.
Non-Final Office Action for U.S. Appl. No. 13/974,488, mailed Oct. 28, 2014, 8 pages.
Non-Final Office Action for U.S. Appl. No. 13/966,400, mailed Sep. 3, 2014, 9 pages.
Final Office Action for U.S. Appl. No. 13/973,482, mailed Nov. 5, 2014, 9 pages.
Advisory Action for U.S. Appl. No. 13/871,526, mailed Sep. 3, 2015, 3 pages.
Non-Final Office Action for U.S. Appl. No. 14/557,940, mailed Aug. 31, 2015, 8 pages.
Notice of Allowance for U.S. Appl. No. 14/067,019, mailed Oct. 13, 2015, 6 pages.

* cited by examiner

GALLIUM NITRIDE (GAN) DEVICE WITH LEAKAGE CURRENT-BASED OVER-VOLTAGE PROTECTION

RELATED APPLICATIONS

This application claims the benefit of U.S. provisional patent application No. 61/692,768, filed Aug. 24, 2012, the disclosure of which is incorporated herein by reference in its entirety.

FIELD OF THE DISCLOSURE

The present disclosure relates to electronic devices that include overvoltage and current surge protection.

BACKGROUND

Gallium nitride (GaN) is commonly cited as a superior material for high-voltage power devices due to its wide bandgap and associated high electric field required for avalanche breakdown. Ideal bulk GaN crystals have critical fields in excess of 3,000,000 V per centimeter. However, in practice, a high electric field needed for avalanche breakdown is lowered by non-idealities that are present within the structure of a GaN device. During high voltage operation of a GaN device, electrical breakdown will typically occur at defects and/or at locations with a concentrated electric field. An example of such a breakdown location is a corner of a Schottky gate. An ideal structure comprising a bulk crystal such as silicon carbide (SiC) or GaN will avalanche uniformly in a high electric field region. As a result, avalanche energy is distributed uniformly, which greatly enhances the survivability of a device made up of an ideal bulk crystal. For example, vertical p-n junctions fabricated in SiC homoepitaxial layers demonstrate avalanche breakdown ruggedness. However, breakdown in defective GaN layers will typically occur at defects within defective GaN layers. A resulting high energy density typically causes irreversible damage to a device that includes defective GaN layers.

Another factor impacting breakdown ruggedness is the nature of the metal semiconductor contacts that carry a breakdown current. Previous work with SiC Schottky diodes has demonstrated that Schottky contacts can be degraded by avalanche current. In response to this problem, junction barrier Schottky diodes have been developed to urge avalanche breakdown to occur across a bulk p-n junction with ohmic contacts rather than Schottky contacts. Thus, the breakdown ruggedness of GaN high electron mobility transistors (HEMTs) may be limited by breakdown events in highly localized areas within a semiconductor due to crystal defects and/or electric field concentration. Moreover, the breakdown ruggedness of GaN HEMTs may be limited by an electrical breakdown of adjacent dielectric layers and/or high current flow through the Schottky gate electrode during breakdown events. Thus, there is a need to provide overvoltage protection for a GaN device to ensure that the GaN device handles a typically destructive breakdown voltage without being damaged.

SUMMARY

A gallium nitride (GaN) device with leakage current-based over-voltage protection is disclosed. The GaN device includes a drain and a source disposed on a semiconductor substrate. The GaN device also includes a first channel region within the semiconductor substrate and between the drain and the source. The GaN device further includes a second channel region within the semiconductor substrate and between the drain in the source. The second channel region has an enhanced drain induced barrier lowering (DIBL) that is greater than the DIBL of the first channel region. As a result, a drain voltage will be safely clamped below a destructive breakdown voltage once a substantial drain current begins to flow through the second channel region.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto"

another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figure 1:
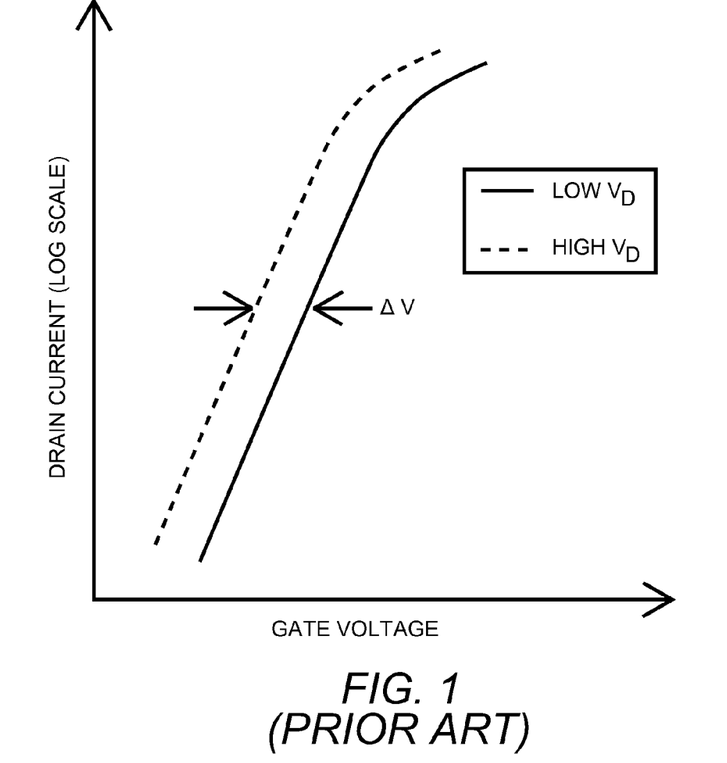
FIG. 1 is a graph of a prior art transfer curve of drain current versus gate voltage illustrating the effect of drain induced barrier lowering (DIBL).

FIG. 1 is a graph of a prior art transfer curve of drain current versus gate voltage illustrating the effect of drain induced barrier lowering (DIBL). In FIG. 1, the drain current is plotted on a logarithmic scale. At a high drain bias voltage, the transfer curve shifts to the left reflecting the lower threshold voltage. DIBL is defined as a ratio of $\Delta V$ to $\Delta V_D$, wherein $\Delta V$ is how much the transfer curve shifts and $\Delta V_D$ is a change in drain bias voltage. Physically, DIBL is associated with drain bias voltage $V_D$, which lowers a barrier that prevents electrons from flowing from a source and a drain of a transistor, when the transistor is in a non-conducting off state.

Figure 2:
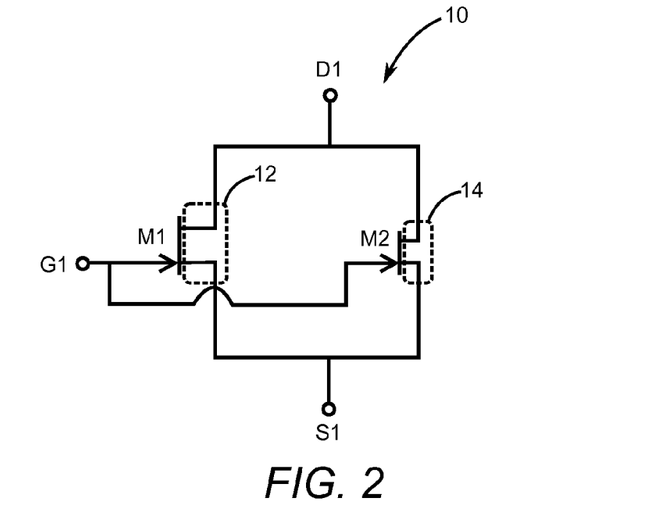
FIG. 2 is a circuit schematic that represents a model of a transistor having a first channel region and a second channel region in which the second channel region has an enhanced DIBL in accordance with the present disclosure.

FIG. 2 is a schematic of a circuit model that represents a transistor 10 having a first channel region 12 and a second channel region 14 in which the second channel region 14 has an enhanced DIBL in accordance with the present disclosure. The transistor 10 is modeled using a symbolic transistor M1 in parallel with a symbolic transistor M2. However, it is to be understood that the first channel region 12 and the second channel region 14 can comprise a same channel periphery of the transistor 10. Moreover, the second channel region 14 has an enhanced DIBL that is greater than the DIBL of the first channel region 12. The enhanced DIBL is symbolically represented by the symbol for the transistor M2 being smaller than the symbol for the transistor M1. In this way, the first channel region 12 is designated as a main channel and the second channel region 14 is designated as a protective channel that leaks current once a protective channel drain voltage $V_{PC}$ is reached. The protective channel drain voltage $V_{PC}$ is below a voltage that is potentially destructive for the transistor 10.

Figure 3:
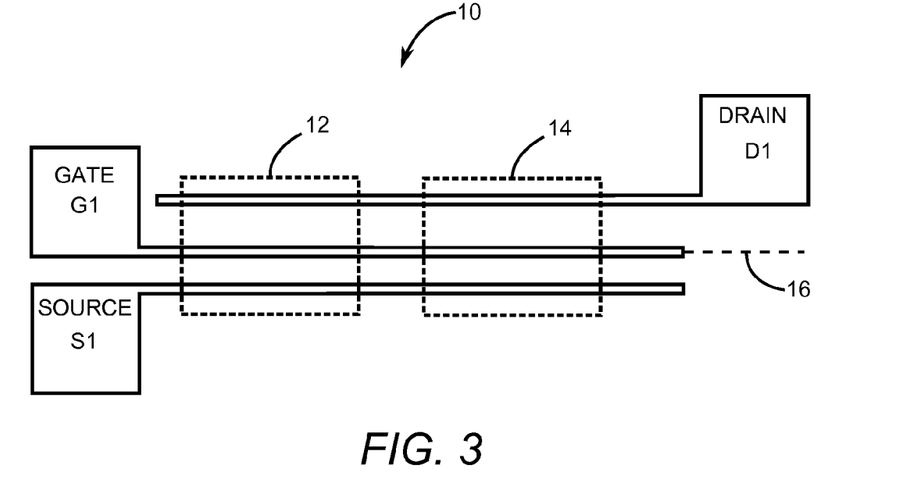
FIG. 3 is a plan view of an exemplary layout for the transistor of FIG. 2.

FIG. 3 is a plan view of an exemplary layout for the transistor 10. The first channel region 12 and the second channel region 14 span between a drain D1 to a source S1. In FIG. 3, the first channel region 12 and the second channel region 14 are shown as being separated and as being approximately the same size. In this case, the second channel region 14 makes up around about 50% of the total channel periphery that includes both the first channel region 12 and the second channel region 14. However, it is to be understood that the first channel region 12 and the second channel region 14 can overlap and be one in the same. In that case, the second channel region 14 would make up 100% of a total channel periphery. In other embodiments, the second channel region 14 accounts for a range of around about 0.1% to around about 10% of the total channel periphery made up of the first channel region 12 and the second channel region 14. In yet other embodiments, the second channel region 14 accounts for around about 10% to around about 50% of the total channel periphery made up of the first channel region 12 and the second channel region 14. In still further embodiments, the second channel region 14 accounts from around about 50% to around about 100% of the total channel periphery made up of the first channel region 12 and the second channel region 14. In some of these embodiments, the first channel region 12 and the second channel region 14 are separate, while in other of these embodiments the first channel region 12 and the second channel region 14 overlap.

Figure 4:
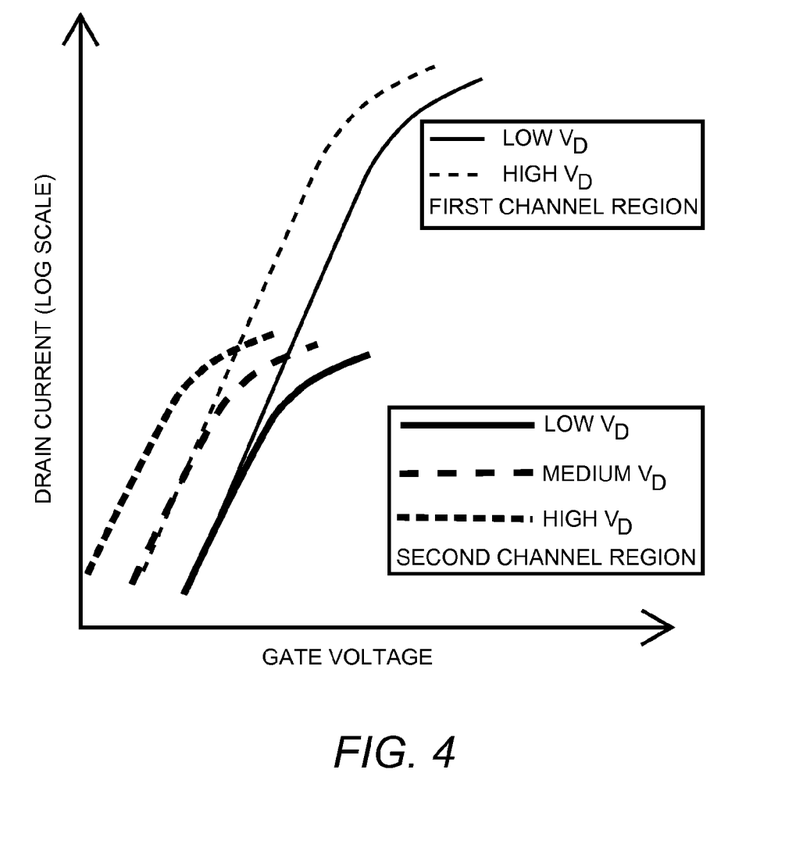
FIG. 4 is a graph of an exemplary transfer curve of drain current versus gate voltage comparing a first DIBL effect for a typical first channel region to a second DIBL effect for a second channel region that has an enhanced DIBL in accordance with the present disclosure.

FIG. 4 is a graph of an exemplary transfer curve of drain current versus gate voltage comparing a first DIBL effect for a typical first channel region to a second DIBL effect for a second channel region that has an enhanced DIBL in accordance with the present disclosure. In particular, FIG. 4 represents a case in which a gate periphery of the second channel region 14 has a relatively high DIBL with respect to a relatively low DIBL of a gate periphery of the first channel region 12. For example, the DIBL of the gate periphery of the first channel region 12 has a negligible DIBL of less than around about 0.001 V/V, which is typical for a DIBL of a traditional GaN HEMT. In contrast, the DIBL of the gate periphery for the second channel region 14 ranges from around about 0.003 V/V to around about 0.03 V/V. As a result, at a high $V_D$, the second channel region 14 will conduct more current than the first channel region 12 as $V_D$ effectively turns on the second channel region 14. The DIBL of the second channel region 14 is enhanced such that it begins to turn on at a $V_D$ that is less than a destructive breakdown voltage of the first channel region 12. Thus, $V_D$ will be safely clamped below the destructive breakdown voltage once a substantial drain current begins to flow through the second channel region 14. In the disclosed embodiments, enhanced DIBL is defined as $\Delta V/\Delta V_{PC}$, where $\Delta V$ is a threshold voltage shift and $V_{PC}$ is a drain voltage at which the second channel region 14 begins to conduct current. A $\Delta V$ for an enhanced DIBL GaN HEMT of the present disclosure ranges from around about 5 V to around about 15 V. In this case, $\Delta V$ is approximately a difference between the unshifted threshold voltage at low $V_D$ and a voltage of a negative voltage rail. A $V_{PC}$ for the second channel region 14 of an enhanced DIBL GaN HEMT of the present disclosure ranges from around about 600 V to around about 1400 V.

In exemplary embodiments, the DIBL of the second channel region 14 is enhanced by segmenting a gate G1 near the second channel region 14, and/or decreasing the gate length, and/or changing the dimensions of a field plate near the second channel region 14, and/or changing the spacing between the gate G1 and the drain D1 near the second channel region 14, and/or altering an epitaxial layer stack including doping near the second channel region 14. The present disclosure may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art. As such, details of well-known features and techniques may be omitted to avoid unnecessarily obscuring the presented embodiments.

Referring back to FIG. 3, segmenting the gate G1 at a location along a gate axis 16 near the second channel region 14 will enhance the DIBL for the second channel region 14. FIGS. 5 through 8 depict four exemplary segmented gate embodiments for enhancing the DIBL of the second channel region 14. Each of FIGS. 5 through 8 represents a cross-sectional view cut along the gate axis 16. The drain D1 and the source S1 shown in FIG. 3 are not shown in FIGS. 5 through 8 because the drain D1 and the source S1 are located on either side of the gate G1, and showing them in FIGS. 5 through 8 would obscure the details of the segmented gate embodiments.

Figure 5:
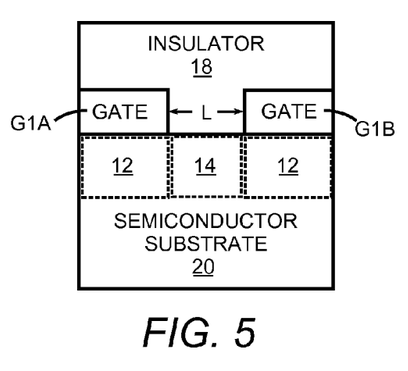
FIG. 5 depicts a cross-sectional view of a first segmented gate embodiment having a Schottky gate with an insulator region between gate segments.

FIG. 5 depicts a cross-sectional view of a first segmented gate embodiment with an insulator 18 between a first gate segment G1A and a second gate segment G1B comprising the gate G1. Moreover, the first gate segment G1A and the second gate segment G1B are coupled electrically by a conductor that is not visible in the cross-sectional view of FIG. 5. In this particular embodiment, the gate G1 is in Schottky contact with a semiconductor substrate 20, and an amount of DIBL enhancement for the second channel region 14 is controlled by an interval L between the first gate segment G1A and the second gate segment G1B.

Figure 6:
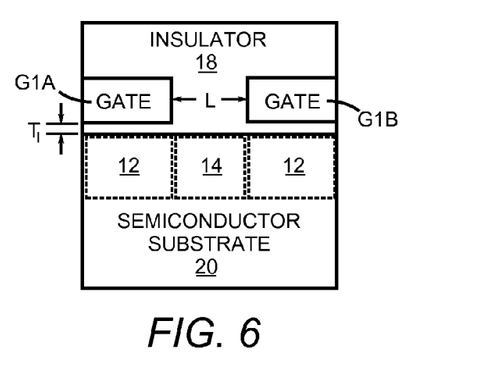
FIG. 6 depicts a cross-sectional view of a second segmented gate embodiment having an insulated gate with an insulator between gate segments and between the gate segments and a semiconductor substrate.

FIG. 6 depicts a cross-sectional view of a second segmented gate embodiment wherein the gate G1 has the insulator 18 extending between the first gate segment G1A and the second gate segment G1B. Further still, the insulator 18 separates the first gate segment G1A and the second gate segment G1B from the semiconductor substrate 20. Thus, the gate G1 in this segmented embodiment is an insulated gate. Similar to the first segmented gate embodiment, the amount of DIBL enhancement for the second channel region 14 is controlled by the interval L between the first gate segment G1A and the second gate segment G1B. However, in this second embodiment, the DIBL of the second channel region 14 can also be controlled locally by varying a thickness $T_I$ of the insulator 18 separating the first gate segment G1A and the second gate segment G1B from the semiconductor substrate 20.

Figure 7:
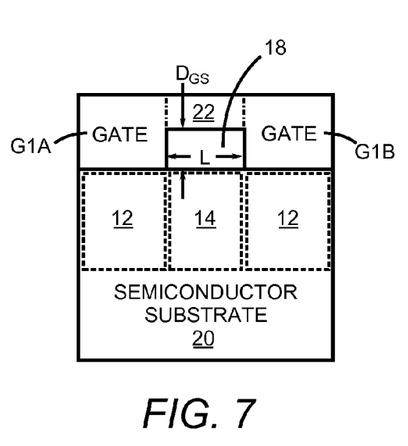
FIG. 7 depicts a cross-sectional view of a third segmented gate embodiment having a Schottky gate with an insulator between gate segments connected by a gate strap.

FIG. 7 depicts a cross-sectional view of a third segmented gate embodiment having a gate strap 22 that electrically couples the first gate segment G1A to the second gate segment G1B that are in direct contact with the semiconductor substrate 20. Thus, the gate G1 is a Schottky gate in this third segmented gate embodiment. Similar to the first and second segmented gate embodiments, the amount of DIBL enhancement for the second channel region 14 is controlled by the interval L between the first gate segment G1A and the second gate segment G1B. However, in this third segmented gate embodiment, the DIBL of the second channel region 14 can also be controlled locally by varying a distance $D_{GS}$ between the gate strap 22 and semiconductor substrate 20.

Figure 8:
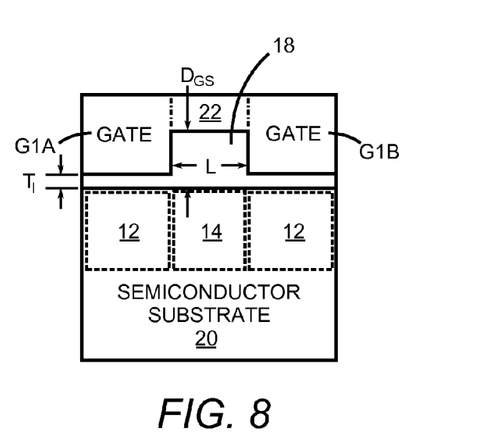
FIG. 8 depicts a cross-sectional view of a fourth segmented gate embodiment having an insulated gate with the insulator between gate segments and a semiconductor region, and between a gate strap and the semiconductor substrate.

FIG. 8 depicts a cross-sectional view of a fourth segmented gate embodiment wherein the insulator 18 extends between the semiconductor substrate 20 and the first gate segment G1A and the second gate segment G1B, thereby making the gate G1 an insulated gate. The insulator 18 also extends between the gate strap 22 and the semiconductor substrate 20. Similar to the first, second, and third segmented gate embodiments, the amount of DIBL enhancement for the second channel region 14 is controlled by the interval L between the first gate segment G1A and the second gate segment G1B. However, in this fourth segmented gate embodiment, the DIBL of the second channel region 14 can also be controlled locally by varying the distance $D_{GS}$ of the gate strap 22 and by varying the thickness $T_I$ of the insulator 18 separating the first gate segment G1A and the second gate segment G1B from the semiconductor substrate 20.

In each of the four exemplary segmented gate embodiments, the first channel region 12 extends into the semiconductor substrate 20 adjacent to both the first gate segment G1A and the second gate segment G1B. The second channel region 14 extends into the semiconductor substrate 20 and being sandwiched between the first channel region 12. Each of the four exemplary segmented gate embodiments depicted in FIGS. 5 through 8 have unique electrical characteristics due to each particular structure made up of the gate G1, the insulator 18, and the semiconductor substrate 20. The electrical characteristics are also tunable by varying the dopant levels of the semiconductor substrate adjacent to the second channel region 14. The unique electrical characteristics affect the DIBL of the second channel region 14 and can be altered to suit a particular application. Also, while the exemplary segmented gate embodiments of FIGS. 5 through 8 show only the first gate segment G1A and the second segment G1B, it is to be understood that additional gate segments can be included without deviating from the scope of the present disclosure. Moreover, while the exemplary embodiments of the present disclosure are directed to GaN transistors, it is to be understood that other GaN devices such as GaN diodes and GaN thyristors can include a main channel region and a protective channel region as described in the present disclosure.

Those skilled in the art will recognize improvements and modifications to the embodiments of the present disclosure. All such improvements and modifications are considered within the scope of the concepts disclosed herein and the claims that follow.

What is claimed is:

1. A gallium nitride (GaN) device with leakage current-based over-voltage protection comprising:
   a semiconductor substrate;
   a drain disposed on the semiconductor substrate;
   a source disposed on the semiconductor substrate;
   a first channel region within the semiconductor substrate and between the drain and the source;
   a second channel region within the semiconductor substrate and between the drain and the source wherein the second channel region has an enhanced drain induced barrier lowering (DIBL) that is greater than the DIBL of the first channel region;
   a gate having gate segments disposed on the substrate adjacent to the second channel region; and
   an insulator extending between the gate segments and the semiconductor substrate, wherein the DIBL of the second channel region is controlled by a thickness of the insulator.

2. The GaN device of claim 1 wherein the DIBL of the first channel region ranges from less than around about 0.001 V/V.

3. The GaN device of claim 2 wherein the DIBL of the second channel region ranges from around about 0.003 V/V to around about 0.03 V/V.

4. The GaN device of claim 1 wherein the DIBL of the second channel region is controlled by an interval distance between adjacent gate segments.

5. The GaN device of claim 4 wherein the gate is directly disposed on the semiconductor substrate.

6. The GaN device of claim 5 further including a gate strap that electrically couples the adjacent gate segments.

7. The GaN device of claim 6 wherein the DIBL of the second channel region is further controlled by a distance of the gate strap from the semiconductor substrate.

8. The GaN device of claim 1 further including a gate strap that electrically couples the adjacent gate segments.

9. The GaN device of claim 8 wherein the DIBL of the second channel region is further controlled by a distance of the gate strap from the semiconductor substrate.

10. The GaN device of claim 1 wherein the first channel region and the second channel region are one and the same.

11. The GaN device of claim 1 wherein the second channel region accounts for a range of around about 0.1% to around about 10% of a total channel periphery made up of the first channel region and the second channel region.

12. The GaN device of claim 1 wherein the second channel region accounts for a range of around about 10% to around about 50% of a total channel periphery made up of the first channel region and the second channel region.

13. The GaN device of claim 1 wherein the second channel region accounts for a range of around about 50% to around about 100% of a total channel periphery made up of the first channel region and the second channel region.

14. The GaN device of claim 1 wherein a drain voltage level for when the second channel region begins to conduct electricity ranges from around about 600 V to around about 1400 V.

* * * * *